METHOD OF APPLYING CONTACTS TO A SEMICONDUCTOR BODY

Filed Sept. 9 1970 2 Sheets-Sheet 1

*INVENTORS*
DIRK DE NOBEL
JAN A.G. DE WAAL
BY [signature]
AGENT

METHOD OF APPLYING CONTACTS TO A SEMICONDUCTOR BODY

Filed Sept. 9 1970 2 Sheets-Sheet 2

INVENTORS
DIRK DE NOBEL
JAN A.G. DE WAAL
BY
AGENT

United States Patent Office 3,698,941
Patented Oct. 17, 1972

3,698,941
METHOD OF APPLYING CONTACTS TO A SEMICONDUCTOR BODY

Dirk de Nobel and Jan A. G. de Waal, Emmasingel, Eindhoven, Netherlands, assignors to U.S. Philips Corporation, New York, N.Y.

Filed Sept. 9, 1970, Ser. No. 70,715
Claims priority, application Netherlands, Sept. 26, 1969, 6914593
Int. Cl. B44d *1/18;* H01l *7/00*
U.S. Cl. 117—212 8 Claims

ABSTRACT OF THE DISCLOSURE

A method of locally applying a metal contact to a semiconductor surface, in which the surface is partly covered by an insulating layer, after which a metal layer is applied to the whole surface. By subjecting the metal layer in accordance with the invention to acoustic high-frequency vibrations, the metal layer is removed from the insulating layer and is left adhering to the semiconductor material. The adhesion may be improved by a thermal treatment prior to the vibration treatment.

Figure 1:
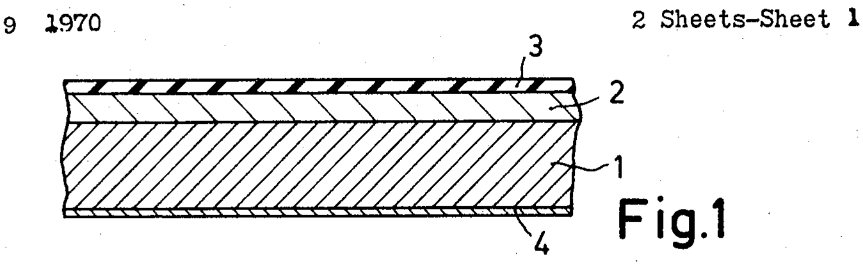

The invention relates to a method of locally applying a metal contact to the surface of a semiconductor body, in which part of the surface is covered by an electrically insulating layer, after which this layer is covered by a metal layer which is located partly on the insulating layer and partly on the semiconductor body, after which the metal layer portion lying on the insulating layer is removed at least partly.

Such methods are frequently used in semiconductor technology. Usually first a surface of the semiconductor body is provided with an insulating layer, for example, by thermal oxidation, after which by using photolithographic etching methods commonly practised in semiconductor technology windows are etched in the insulating layer at the areas to be contacted of the semiconductor surface. Then the whole surface is covered by a metal layer, for example, by vapour deposition, after which by using a second photolithographic etching process the redundant parts of the metal layer are etched off.

In practice, conditions may be such that the use of the known process described gives rise to difficulties. This applies, for example, to the case in which the metal layer employed can be removed only with difficulty by etching or only by etching agents which attack not only the metal but also, to an undesirable extent, the photoresist materials used. The use of such metals may be required for some purposes, for example, for the manufacture of rectifying metal-semiconductor contacts (Schottky diodes).

A further difficulty may arise when the metal contacts to be made are very small and have dimensions of, for example, only a few microns. Since the known methods require at least two masking steps, one for etching the contact windows and one for determining the dimensions of the metal contact, particularly the orientation of the second mask with respect to the first may in this case give rise to great difficulties and adversely affect the reproducibility. This applies particularly to the case in which, for example, for avoiding unwanted capacitances overlapping of the insulating layer by the metal layer for the contacts has to be avoided as much as possible.

The invention has for its object inter alia to provide a novel method in which the difficulties involved in the known methods are substantially eliminated.

The invention is based inter alia on the recognition that by using acoustic high-frequency oscillations a quite novel method of contact establishing is possible, while as compared with known methods at least one masking step and one aligning step can be omitted.

A method of the kind set forth in accordance with the invention is characterized in that after its deposition the metal layer is subjected to acoustic high-frequency vibrations so that the metal layer portion lying on the insulating layer is removed substantially completely, while the metal layer portion lying on the semiconductor body and serving as a contact layer remains adhering to the semiconductor material.

The method according to the invention has inter alia the important advantage that even metals may be used, which can be etched only with difficulty or only by etchants which also attack strongly the photoresist. No mask is required for defining the dimensions of the contact layer so that no alignment is necessary and even very small contacts can be provided in a simple and effective manner.

It is preferred to provide a metal layer of a thickness smaller than the thickness of the insulating layer. This faciltates the removal of the metal layer from the insulating layer.

In order to ensure an adequate adhesion between the metal and the semiconductor material so that at the area of the contact the metal layer is not removed or damaged by the high-frequency vibrations, it is desirable under given conditions for the semiconductor body with the metal layer deposited thereon to be heated before the metal layer is subjected to the acoustic high-frequency vibrations.

In general it is advisable to ensure that at the area of the boundary between the semiconductor body portion covered by the insulating layer and the uncovered portion a sharp gradation of the surface is obtained. In this way a very sharply defined edge of the contact area is obtained, since under the action of the acoustic high-frequency vibrations at the area of the sharp "edge" in the surface the metal layer portion lying on the insulating layer is readily detached from the metal layer portion lying on the semiconductor surface.

With regard thereto the thickness of the insulating layer is preferably chosen not to be too small; it is at least equal to 0.1 $\mu$m. In a further preferred embodiment this effect is magnified by etching away the semiconductor surface portion not covered by the insulating layer to a depth of at least 1 $\mu$m. prior to the deposition of the metal layer. Preferably the metal layer is applied to an insulating layer of siliconoxide.

The method according to the invention is particularly advantageous when platinum is used for the metal layer. Platinum can be etched only with great difficulty and is effectively employed inter alia for making Schottky diodes on silicon and for establishing a contact on the emitters of high-frequency silicon transistors.

The invention is furthermore particularly interesting in those cases in which the semiconductor surface portions not covered by the insulating layer are located inside contact windows in the insulating layer having dimensions of at the most 10 $\mu$m. With such small dimensions the use of known photoresist methods is difficult, particularly with respect to alignment.

The resultant metal-semiconductor contacts may be provided with a connecting conductor in the form of a conductive wire, for example, a whisker contact. If it is preferred, however, to connect the contact formed in accordance with the invention by means of a metal strip deposited on the insulating layer, as is common practice to do in integrated circuits, a strip of a metal adhering so strongly to the insulating layer that it is not removed by the vibration treatment can be deposited on the insulating layer by known methods before the metal layer having to form said metal-semiconductor contact is applied. Such an adhesion may be obtained, for example, by using chromium on silica. The invention also relates to a semiconductor device having a contact manufactured by the described method.

The invention will now be described more fully with reference to a few embodiments and the drawing, in which:

FIGS. 1 to 5 show schematically in cross-sectional views the manufacture of a semiconductor device in consecutive stages of the method according to the invention; and FIGS. 6 to 10 show schematically in cross-sectional views the manufacture of a further semiconductor device in consecutive stages of the method in accordance with the invention.

The figures are drawn schematically and not to scale and particularly the dimensions in the direction of thickness are shown on an exaggerated scale for the sake of clarity.

FIGS. 1 to 5 illustrate the method in accordance with the invention with reference to the manufacture of a so-called mixer diode. The basic material is a wafer of n-type silicon having a diameter of 30 mm. and a thickness of about 100 $\mu$m. This wafer (see FIG. 1) comprises an n-type substrate 1 of a resistivity of 0.01 ohm cm., on which an epitaxial layer 2 of n-type silicon of a resistivity of 0.2 ohm. cm. and of a thickness of 2 $\mu$m. is grown. A great number of mixer diodes can be made on said wafer; FIGS. 1 to 4 show schematically a sectional view of only part of the wafer in consecutive stages of manufacture.

The wafer is provided by thermal oxidation at 1200° C. in wet oxygen with a 0.3 $\mu$m. thick layer 3 of silica. After this oxidation the oxide is removed by grinding from the side of the wafer remote from the epitaxial layer 2, after which, as shown in FIG. 1 by chemical agency (electro-less) one side is provided with a nickel layer 4, which is subsequently heated at a temperature of 600° C. in order to estbalish a satisfactory low-ohmic contact between the nickel and the silicon.

Figure 2:
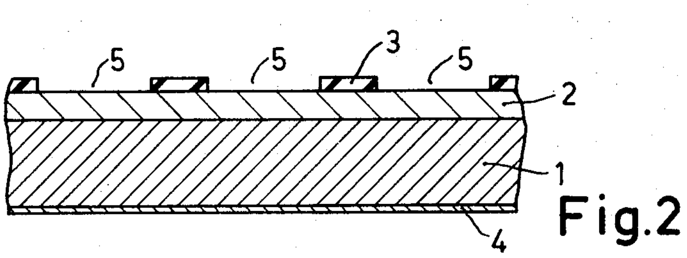

Subsequently, by using photoresist methods generally employed in semiconductor technology, square holes 5 as indicated in FIG. 2, are etched in the oxide layer 3, the holes having sides of 5 $\mu$m. and a pitch of 7 $\mu$m. in the direction of the sides. The term "pitch" as applied to a row of identical figures is the distance over which one figure of the row has to be translated in the direction of the row in order to coincide with the next figure. Then, the whole surface is covered by vapour-deposition by a nickel layer 6 of a thickness of 0.1 $\mu$m. This nickel layer 6 thus lies partly on the oxide layer 3, but it is located within the windows 5 on the epitaxial silicon layer 2, with which the nickel establishes a rectifying contact (Schottky contact).

Figure 3:
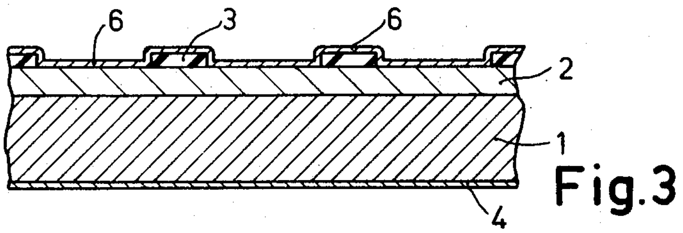
Figure 4:
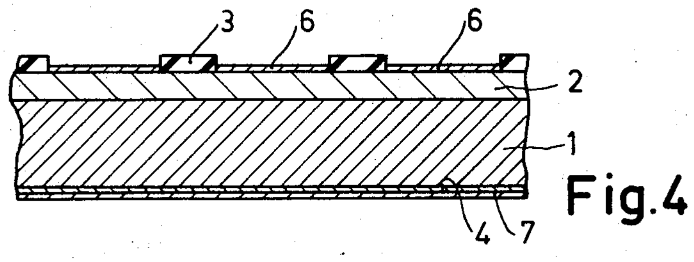

In accordance with the invention, the resultant structure shown in FIG. 3 is subjected to acoustic high-frequency vibrations in a water bath. In the present embodiment the frequency of these vibrations was 21 kHz. and the power of the supplied vibratory energy was 35 w. As a result thereof the portions of the nickel layer 6 lying on the oxide layer 3 are disengaged starting from the sharp edges of the windows 5. The nickel layer portions 6 lying in the windows 5 on the silicon, however, remain sticking to the silicon. This results in the structure shown in FIG. 4, in which a further nickel layer 7 has been applied to the nickel layer 4 in the same manner as the latter in order to improve solderability.

Figure 5:
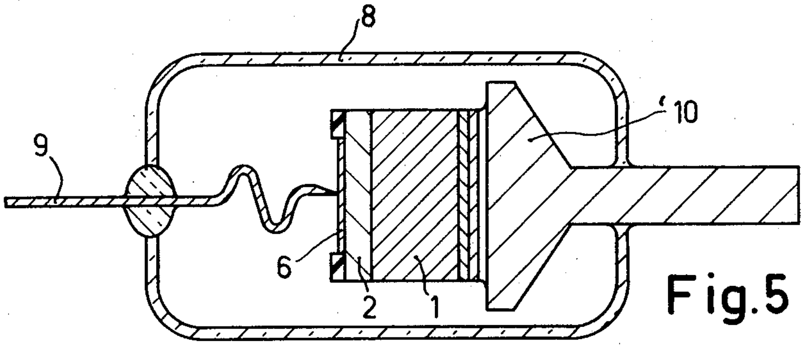

The wafer is then divided in a conventional manner by scratching and breaking into portions of 700 x 700 $\mu$m., which are housed in a glass envelope 8, as is shown schematically in FIG. 5. The nickel layer 6 is contacted by a molybdenum whisker contact 9 and on the other side the silicon body is soldered to a metal base 10.

For the sake of clarity, FIG. 5 shows only one diode. In fact the semiconductor portion of 700 x 700 $\mu$m. comprises a very great number of diodes, only one of which is contacted by a whisker contact 9 as is common practice in contacting such very small elements.

The vibration treatment described above may be carried out in a different way; for example, in order to avoid breakage, the semiconductor wafer may be cemented to a support during this treatment. The high-frequency vibration energy may be applied in a different way than via a water bath, for instance by fixing the wafer to a support which is submitted to the vibrations, whereas the frequency and power used are not critical.

Figure 6:
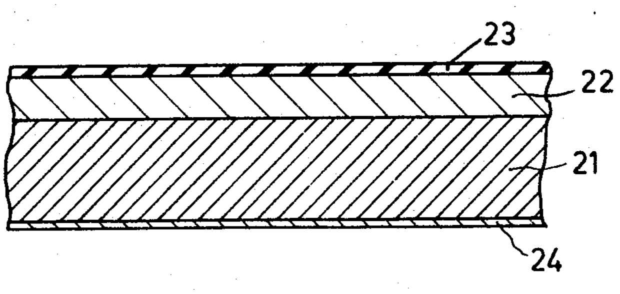

FIGS. 6 to 10 illustrate the method in accordance with the invention with reference to the manufacture of a switching diode. The basic material is a silicon wafer, as shown in FIG. 6, about 100 $\mu$m. thick comprising a substrate 21 of n-type silicon of a resistivity of 0.01 ohm.cm., on which an epitaxial n-type silicon layer 2 of a resistivity of 0.6 ohm.cm. and a thickness of 6 $\mu$m. is grown. On the layer 22 a layer 23 of silica of a thickness of 0.3 $\mu$m. is provided by heating at about 400° C. in a stream of 0.1% by volume of $SiH_4$, 1% by volume of oxygen and 98.9% by volume of argon by conventional techniques. After the formation of this oxide layer, a nickel layer 24 is applied and sintered in the same manner as in the preceding example to the other side of the silicon wafer.

Figure 7:
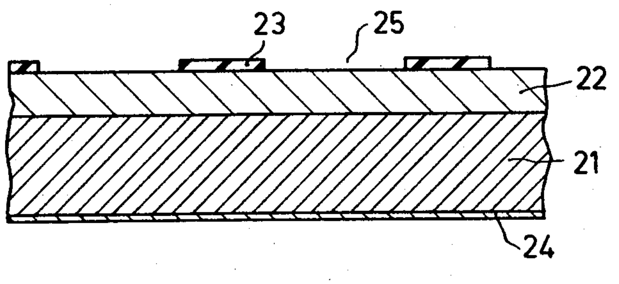
Figure 8:
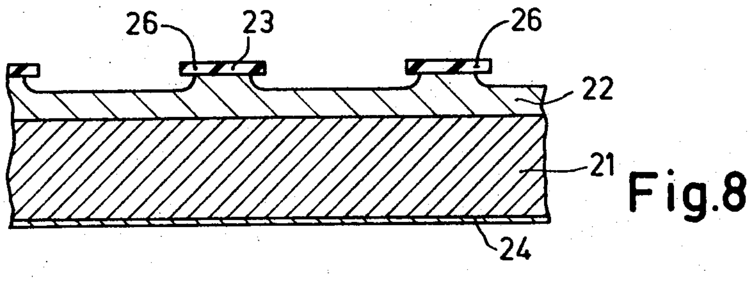

Square holes 25 of sides of 30 $\mu$m. and a pitch of 40 $\mu$m. in the directions of the sides as shown in FIG. 7 are etched in the silica layer 23, after which the silicon in the windows 25 is etched away to a depth of 2 $\mu$m. by a solution of 1 part by volume of 48% HF and 5 parts by volume of 65% $HNO_3$, during which treatment also part of the silicon beneath the oxide layer 23 is etched away. Thus freely protruding oxide edges 26 are formed, see FIG. 8.

Figure 9:
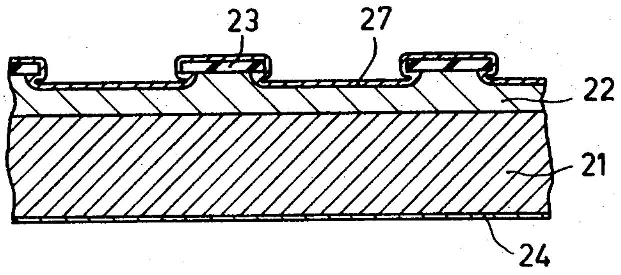
Figure 10:
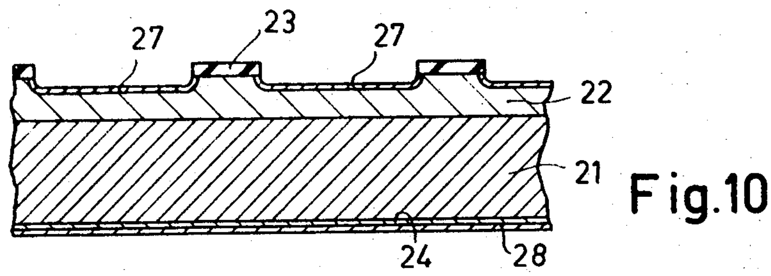

In known manner, by sputtering, a layer 27 of platinum of a thickness of 0.1 $\mu$m., as shown in FIG. 9, is applied to the whole surface of the wafer. In order to ensure satisfactory adhesion of the platinum in the windows to the silicon, the assembly is heated at about 300° C. in a mixture of nitrogen and hydrogen for about 15 minutes. The platinum establishes a Schottky junction with the epitaxial layer 22.

Subsequently, in the same manner as in the preceding example, the structure is subjected in a water bath to acoustic high-frequency vibrations. As a result, not only the platinum of the oxide layer 23 but also the protruding oxide edges 26 are removed (see FIG. 10). Thus separate platinum Schottky contacts are obtained. After the deposition of a further nickel layer 28 on the layer 24 (see FIG. 10) for improving solderability the diodes are severed by scratching and breaking and housed in an appropriate envelope in the same manner as described in the preceding example.

In this example the layer 23 was applied at a low temperature so that the number of crystal defects in the layer 22 is kept low. Thus, the cavities resulting from etching of the layer 22 in the windows 25 have an improved surface with fewer etching pits. In this example of the method, in accordance with the invention, the elimination of platinum from the layer 23 is highly facilitated also owing to the disappearance of the protruding oxide edges 26 by the high-frequency vibration treatment.

It will be obvious that the invention is not restricted to the examples given and that within the scope of the invention many variants will be possible to those skilled in the art. For example, instead of nickel and platinum other metals may be employed, e.g. gold and titanium. The invention may be used advantageously not only for the manufacture of Schottky contacts but also for the manufacture of non-rectifying metal-semiconductor contacts. Instead of silicon a different semiconductor material may be used, for example, germanium or a III–V compound and instead of silica insulating layers of other materials e.g. silicon nitride or alumina may be used.

What is claimed is:

1. A method of locally applying a metal contact to the surface of a semiconductor body, comprising the steps of providing a semiconductor body having a major surface, covering a portion of the major surface with an electrically insulating layer, a part of the major surface being free of the insulating layer, depositing a metal layer onto the part of the major surface free of the insulating layer and at least on a portion of the insulating layer, and subjecting all of the metal layer to acoustic high frequency vibrations until the metal layer portions on the insulating layer are removed, the metal layer remaining on the major surface being the metal contact.

2. A method as claimed in claim 1, wherein the metal layer is applied in a thickness which is smaller than the thickness of the insulating layer.

3. A method as claimed in claim 1, further comprising the step of heating the semiconductor body before subjecting the metal layer to acoustic high frequency vibrations.

4. A method as claimed in claim 1, further comprising the step of etching off over a depth of at least 1 $\mu$m. of the major surface free of the insulating layer.

5. A method as claimed in claim 1, wherein the insulating layer is silicon oxide.

6. A method as claimed in claim 1, wherein the metal layer is platinum.

7. A method as claimed in claim 1, wherein the insulating layer has a thickness of a .1 $\mu$m.

8. A method as claimed in claim 1, wherein the part of major surface free of insulating layer is located inside a contact window in the insulating layer, said contact window having dimensions of at most 10 $\mu$m.

References Cited

UNITED STATES PATENTS

| | | | |
|---|---|---|---|
| 3,476,984 | 11/1969 | Tibol | 117—212 X |
| 3,501,833 | 3/1970 | Spiegler | 117—212 X |
| 3,512,051 | 5/1970 | Noll | 117—212 X |
| 3,153,600 | 10/1964 | Feuillade et al. | 117—227 X |
| 3,451,296 | 6/1969 | Alexander, Jr. | 134—1 X |

ALFRED L. LEAVITT, Primary Examiner

K. P. GLYNN, Assistant Examiner

U.S. Cl. X.R.

117—8, 37, Dig. 8; 134—1; 156—5, 17